United States Patent [19]

Emesh

[11] Patent Number: 5,407,698
[45] Date of Patent: Apr. 18, 1995

[54] DEPOSITION OF TUNGSTEN

[75] Inventor: Ismail T. Emesh, Cumberland, Canada

[73] Assignee: Northern Telecom Limited, Montreal, Canada

[21] Appl. No.: 875,960

[22] Filed: Apr. 30, 1992

[51] Int. Cl.$^6$ .................. C23C 16/08; C23C 16/52; C23C 16/56; C23C 16/28

[52] U.S. Cl. .................. 427/99; 427/250; 427/255.2; 437/187; 437/192

[58] Field of Search .............. 427/99, 250, 255.2, 427/187, 192

[56] References Cited

U.S. PATENT DOCUMENTS

| | | | |
|---|---|---|---|
| 4,517,225 | 5/1985 | Broadbent | 427/99 X |
| 4,617,087 | 10/1986 | Iyer et al. | 427/91 X |
| 4,741,928 | 5/1988 | Wilson et al. | 427/250 |
| 4,749,597 | 6/1988 | Mendonca et al. | 427/255.1 X |
| 4,777,061 | 10/1988 | Wu et al. | 427/39 |
| 4,923,715 | 5/1980 | Matsuda | 427/255 X |
| 5,028,565 | 7/1991 | Chang | 437/192 |
| 5,175,017 | 12/1992 | Kobayashi et al. | 427/255.2 X |
| 5,211,987 | 5/1993 | Kunishima et al. | 427/99 X |

FOREIGN PATENT DOCUMENTS 61-198628 9/1986 Japan .

OTHER PUBLICATIONS

Riley et al., "Integrated Chemical Vapor Deposition and Plasma Etchback of Tungsten", *J. Electrochem. Soc.*, v. 138, No. 10, pp. 3008–3013 (Oct. 1991).

R. W. Haskell & J. G. Byrne "Studies in Chemicial Vapour Deposition". Treatise Mater. Sci. Techno 1972, vol. 1, pp. 293–340; ed. H. Herbert (Academic Press N.Y.) month not known.

Riley et al., Chemical Abstracts, 115:245594t (1991). month not known.

*Primary Examiner*—Paul Lieberman
*Assistant Examiner*—Douglas J. McGinty
*Attorney, Agent, or Firm*—Angela C. de Wilton

[57] ABSTRACT

A method is provided for low pressure chemical deposition of tungsten and tungsten metallization for defining interconnects for an integrated circuit. A surface layer of tungsten is provided which has a low film stress and a smooth surface characterized by a low diffuse reflectivity and high specular reflectivity, to facilitate photolithography. Tungsten is deposited by reduction of $WF_6$ with $H_2$ and $SiH_4$ in nitrogen. Control of the gas flow rates, pressure, temperature and $H_2/WF_6$ ratio in the reactive gas mixture provides for tailoring of the structure and characteristics of a deposited tungsten layer to provide high step coverage or a smooth surface for forming an overlying layer of tungsten which may be patterned photo-lithographically for defining interconnect. In order to provide metallization providing both good step coverage in via and contact holes and smooth surface for deposition of surface metallization, a two-stage tungsten deposition is provided.

8 Claims, 5 Drawing Sheets

DEPOSITION OF TUNGSTEN

FIELD OF THE INVENTION

This invention relates to a method of deposition of tungsten and tungsten metallization for integrated circuits.

BACKGROUND OF THE INVENTION

In fabrication of CMOS devices for VLSI integrated circuits, tungsten is a preferred alternative to conventional aluminium (Al) alloys for metal interconnect and for submicron contacts and vias, particularly where high current density is required. As device dimensions become smaller and the packing density of high speed devices increases, reduced metallization linewidth requires the formation of smaller contacts and vias with vertical sidewalls. In use of tungsten for contacts and vias, tungsten has high resistance to electromigration, provides superior step coverage and does not form hillocks. On the other hand, thin layers of tungsten have a higher sheet resistance than conventional aluminium alloys. For example, for use of tungsten as interconnect metallization, deposition of a film of about 1 $\mu$m thickness of tungsten may be required to provide the desired resistivity, of 8–9 $\mu\Omega$cm, typically ~8.3 $\mu\Omega$cm.

A thin film of tungsten may be formed by chemical vapour deposition (CVD). In a conventional CVD process, tungsten hexafluoride, $WF_6$, is reduced by hydrogen, $H_2$, in argon carrier gas, at a pressure of ~1 Torr. The superior step coverage of CVD tungsten film, relative to sputtered aluminium alloys, provides that vias and contact holes can be filled by blanket deposition of tungsten overall and subsequent etching back of excess tungsten to leave tungsten only in contact holes and vias. In this scheme, aluminium is used as metal interconnect. In use of tungsten for interconnect applications, a conformal CVD tungsten film may be deposited which is capable of filling holes having high aspect ratios and providing contact plugs in vertical walled contact holes.

Tungsten does not adhere well to common dielectric materials, including silicon dioxide $SiO_2$. Satisfactory adhesion to the substrate is required for tungsten films both for filling of contact and via openings and for use of tungsten as interconnect. A known method of improving the adhesion of tungsten to substrate is deposition of an adhesion layer, for example TiN or TiW, before deposition of tungsten. The adhesion layer allows for formation of strong chemical bonds between layers of tungsten and a dielectric such as $SiO_2$.

Known processes for deposition of films of tungsten metallization of 1 $\mu$m thickness and having the desired resistivity produce films with a rough surface and high film stress. During deposition of thin tungsten films (<2000 Å) using a conventional CVD process, in which $WF_6$ is reduced by $H_2$ in argon carrier gas, at a pressure of ~1 Torr, the tungsten film initially has small grains, but the grains grow and form long columnar grains in the growth direction as film thickness increases. The columnar grains have pyramidal caps forming the surface of the film. Consequently, the resulting film has a rough surface. Also, film of this structure has a tensile film stress of ~$10^{10}$ dyne/cm$^2$. This stress is much greater than that desirable to match, or compensate, the film stress of an underlying film of dielectric, such as $SiO_2$, which typically has a compressive film stress of ~2 ×$10^9$ dynes/cm$_2$.

Surface roughness of tungsten films deposited by known CVD processes increases with increasing film thickness. Surface roughness affects the optical properties of the film and reduces specular reflectivity (and conversely increases diffuse reflectivity) in the spectral region used for photo-lithography (around 436 nm). The recognition of alignment marks may be repeatable and accurate only for a film thickness less than 5000 Å. Typical tungsten film of ~8000 Å thickness, deposited by known CVD processes which provides good step coverage, has a specular reflectivity of 20% or less compared to a silicon reference wafer. When the specular reflectivity of a rough film is reduced to such an extent, or if surface roughness is significant enough to obscure alignment marks, subsequent photo-lithographic alignment for patterning of interconnect structure is impossible. Consequently use of thick tungsten films for interconnects is impracticable.

Another disadvantage of conventional processes for deposition of a thin film of tungsten on silicon by reduction of $WF_6$ with hydrogen results from a significant amount of volatile products such as HF, and the presence of $WF_x$ species, which attack the underlying silicon, and result in undesirable etching and pitting of the silicon surface during deposition.

In another known method of chemical vapour deposition of tungsten by reduction of $WF_6$ with silane it is found that there is reduced pitting and etching of a silicon substrate. A higher rate of deposition may be obtained by reduction of $WF_6$ with silane instead of hydrogen. The resulting tungsten film has a smoother surface. However, the resulting film has poor step coverage, and adhesion to the underlying silicon is inferior. Poor adhesion may result in problems such as lifting of the film and particulate contamination, as well as poor electrical performance and reliability.

To improve adhesion, U.S. Pat. 5,028,565 to Chang et al. for example, describes use of an adhesion layer, followed by deposition of a thin nucleation layer of tungsten before deposition of the major thickness of tungsten by a method of CVD of tungsten using a conventional mixture of reactive gases including $WF_6$, $H_2$, in a carrier gas of argon, carried out in the presence of nitrogen. The '565 patent discloses that deposition in the presence of nitrogen and at higher pressures up to 760 Torr, preferably at ~80 Torr, together with high gas flow rates, and elevated temperature, 450°–475° C., resulted in smoother tungsten films. The resulting tungsten film showed increased specular reflectivity of the deposited tungsten surface, near 100% relative to silicon, which facilitated the use of photolithography in the subsequent patterning step. However, when the tungsten deposition was carried out in the presence of nitrogen at low pressure, at 10 Torr, the specular reflectivity of the tungsten film was reduced to only 20%. The increased pressure, together with high gas flow rates and increased temperature, resulted not only in a tungsten film having a smoother surface, but also in increased tungsten deposition rates by up to an order of magnitude (2000–7000 Å/min) compared with conventional known methods (~300 Å/min).

On the other hand, as a practical matter, it is not possible to operate many known CVD reactors at the higher pressures, ≧80 Torr, required for the method disclosed in the '565 Patent to Chang to achieve deposition of tungsten films having a smooth surface suitable for interconnect. Thus, practical difficulties are encountered in using low pressure CVD to provide tungsten films having good adhesion, a smooth surface for use as interconnect and satisfactory step coverage for filling contact via holes.

SUMMARY OF THE INVENTION

The present invention seeks to provide a method of depositing tungsten and a method of providing tungsten metallization for integrated circuits in which the above-mentioned problems are reduced or avoided.

According to one aspect of the present invention, there is provided a method of depositing tungsten comprising: exposing a substrate to a mixture of gases comprising $WF_6$ and $H_2$ in a carrier gas, the mixture of gases thereby depositing a tungsten film on the substrate, and the carrier gas comprising predominantly a species other than an inert gas, the carrier gas being substantially unreactive with the mixture of gases in the gas phase and the carrier gas being selectively adsorbed on a surface of the tungsten film.

By deposition of tungsten by CVD in the absence of argon or other inert gas, but in the presence of a carrier gas which is known to adsorb on tungsten, and which is substantially unreactive in the gas phase, it was found that the surface roughness of deposited tungsten film was significantly reduced over a wide range of flow rates and pressures of the reactive gases.

Preferably the carrier gas is a gas which adsorbs by chemisorption on tungsten. A preferred carrier gas is nitrogen, and smooth tungsten films were deposited by reduction of $WF_6$ with hydrogen in the presence of a carrier gas comprising predominantly of nitrogen, over a range of flow rates and pressures, and in which the ratio of gas flow rates for $H_2/WF_6$ was in a range from about 5 to 30. Smooth films of tungsten were obtained in the temperature range from about 350° C. to 600° C., and advantageously, film stress was reduced for deposition at a higher end of this temperature range. However, the preferred deposition temperature is 480° C. to avoid excessive thermal diffusion effects in the substrate. High deposition rates were obtained at a low pressure, ~9 Torr, and low gas flow rates, and the resulting films had low film stresses.

Advantageously, a minor proportion of $SiH_4$ is added to the reaction gases to increase the deposition rate of tungsten.

According to another aspect of the invention, there is provided a method of forming tungsten metallization for an integrated circuit, comprising: providing a substrate having a layer of dielectric, and an underlying conductive layer, the dielectric layer defining a via hole therethrough, the via hole having a steep sidewall and exposing the underlying conductive layer within the bottom of the via hole; depositing a layer of a first thickness of tungsten, the first thickness of tungsten extending over the bottom and sidewalls of the via hole to substantially fill the via hole; subsequently depositing a layer of a second thickness of tungsten overall, the second thickness of tungsten having a smaller grain size than the first thickness of tungsten and providing a relatively smooth surface.

Preferably, the layer of the first thickness of tungsten is deposited by hydrogen reduction of $WF_6$ in a carrier gas comprising argon or nitrogen, with a $H_2/WF_6$ ratio of 6 to provide good step coverage of >60%. Advantageously, the layer of the second thickness of tungsten is deposited by hydrogen reduction of $WF_6$ in nitrogen and in the absence of argon, with a $H_2/WF_6$ ratio increased to about 20 to produce a tungsten layer having a smaller grain size, and smoother surface, to ensure low diffuse reflectivity. Beneficially, a minor proportion of silane is added to the reactive gas mixture to increase the deposition rate and further reduce the surface roughness. Thus a multi-step deposition process provides tungsten metallization having a smooth surface, low stress and good step coverage. Since the desired properties of a tungsten film depend on its application, the tungsten film used for filling contact and via openings requires excellent step coverage ~90% and good deposition uniformity but large grain sizes and high stress may be tolerated. In contrast, the surface layer of tungsten forming interconnect structures has a smooth surface (i.e. small grain size) to facilitate photolithography, low resistivity, and low film stress, and, where interconnect is deposited on at least partially planarized topography, lower step coverage is acceptable.

According to another aspect of the present invention there is provided an integrated circuit structure having tungsten metallization, comprising: a substrate having a layer of dielectric and an underlying conductive layer, the dielectric defining a contact via hole therethrough having steep sidewalls; a layer of a first thickness of tungsten extending into the contact via holes and forming an electrically conducting contact with the underlying conductive layer within a bottom of the contact via hole, the first thickness of the tungsten layer extending into contact vias with >60% step coverage, and an overlying layer of a second thickness of tungsten, the surface of the overlying layer of tungsten having a relatively smooth surface.

Thus deposition parameters are selected to provide a tungsten film having desired properties, for example, first and second thicknesses of tungsten may form a composite layer of tungsten in which the first thickness provides desired properties for contact via hole filling and the second thickness provides a smooth surface for interconnect metallization.

Thus, the present invention provides a method of depositing tungsten, a method of forming tungsten metallization for an integrated circuit, and an integrated circuit structure which reduces or overcomes the above mentioned problems.

BRIEF DESCRIPTION OF THE DRAWINGS

Embodiments of the invention will now be described by way of example, with reference to the accompanying drawings, in which.

DESCRIPTION OF THE PREFERRED EMBODIMENT

In a method of deposition of tungsten according to embodiments of the present invention, as described below, a layer of tungsten for metallization of an integrated circuit was deposited in a conventional CVD apparatus which comprised a Varian 5101 cold wall, low pressure CVD reactor system. The wall of the reactor chamber was kept at a temperature around 17° C. to minimise the deposition of tungsten at the wall. The system was furnished with a loadlock connected to a turbomolecular pump to achieve a base pressure of approximately $10^{-6}$ Torr in the chamber.

A substrate, in the form of a semiconductor silicon wafer, was clamped to a graphite chuck within the reactor chamber, with the wafer surface facing downwards, and was heated radiantly, with eight halogen lamps to a desired processing temperature. A thermocouple was located in the chuck to monitor the chuck temperature. To maintain good heating uniformity the diameter of the graphite chuck was larger (250 mm) than the wafer diameter (for 100 mm and 150 mm wafers) and a temperature gradient of not more than 10° C. was maintained across the wafer diameter.

A mixture of reactant gases comprising $WF_6$, $H_2$, and a selected carrier gas was introduced at controlled flow rates into the reactor chamber through a gas delivery system comprising a tube with small holes located at the bottom of the reactor. The reacting gases were uniformly distributed using a diffusion plate located at about 100 mm from the tube. The diffusion plate controls the uniformity of the film thickness across the wafer: the distance between the diffusion plate and the wafer controls the fluid dynamics of the reactant gas mixture and hence the distribution of reacting species at the surface of the wafer to provide for uniform deposition of a layer of tungsten over the surface of the wafer.

Deposition was carried out at temperatures in the range from 350°–600° C. and at pressures in the range from several mTorr to 10 Torr.

Gas flow rates were controlled to provide gas mixtures having a predetermined $H_2/WF_6$ ratio and flow rates measured in sccm (standard cubic centimeters per minute), as follows: $WF_6$ 10–40 sccm and $H_2$ 240–800 sccm to provide a $H_2/WF_6$ ratio between 5 and 30; $SiH_4$ flow rate 0–15 sccm; in a carrier gas comprising nitrogen or an inert gas at a flow rate of ~90 sccm.

Figure 1A:
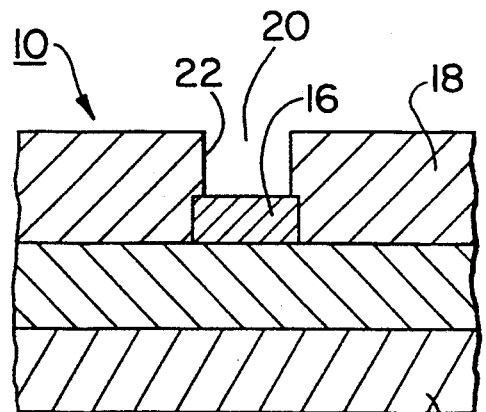
FIG. 1a–1e shows a schematic cross-sectional view of part of an integrated circuit structure at successive stages in a method of deposition of tungsten according to a first embodiment of the present invention.
Figure 1B:
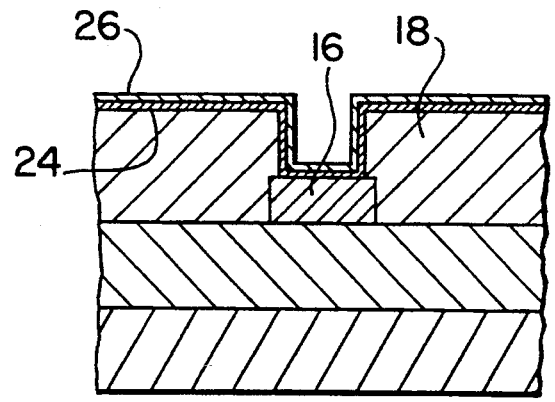

In a method according to a first embodiment of the invention, a tungsten film was deposited on a substrate 12 comprising a silicon semiconductor wafer 14 having parts of a partially fabricated integrated circuit defined thereon, including a first conductive layer 16 and an overlying surface layer 18 of a insulating dielectric material defining steep-sided via holes 20 therethrough (FIG. 1a). The via holes 20 are provided by a conventional known method, for example, after chemical vapour deposition of a dielectric layer 18 of silicon dioxide, the layer 18 was coated with resist material, patterned and anisotropically etched to define contact via holes 20 having steep side walls 22. After stripping the resist, the substrate was coated with a thin layer (~800 Å) of TiN 24 to provide an adhesion layer (FIG. 1b). The TiN coating 24 was deposited by a conventional known method, i.e. sputtering.

A thin nucleation layer 26 of tungsten was then deposited over the adhesion layer by CVD reduction of tungsten hexafluoride with hydrogen. The wafer was preheated to 480° C. in a non-reactive gas, e.g. nitrogen, for 120 seconds at a pressure of 100 mTorr, flow rate of 90 sccm. A reactive gas mixture comprising $H_2$, $WF_6$ and $SiH_4$ in a carrier gas of nitrogen was then introduced into the reaction chamber at a controlled, low flow rate to provide a predetermined ratio of $H_2/WF_6$ so as to deposit a thin layer of ~1000 Å of tungsten on the substrate (FIG. 1b). For example, the resulting nucleation layer of tungsten has good adhesion and good step coverage (>60%) when deposited on the substrate by hydrogen reduction of $WF_6$ at a high $H_2/WF_6$ ratio, ~20 to 25, and in the presence of a low partial pressure of $SiH_4$ (~5 sccm) and at a total pressure of ~100 mTorr. In deposition of the adhesion layer, the presence of silane did not degrade the step coverage, at the expense of adhesion, and silane flow rates above 10 sccm significantly degraded adhesion. As an example, process parameters are listed in Example 1, step 2 in which a preferred flow rate was 4 sccm of silane and a $H_2/WF_6$ ratio of 25, with 90 sccm of nitrogen at a total pressure of 250 mTorr.

Figure 1C:
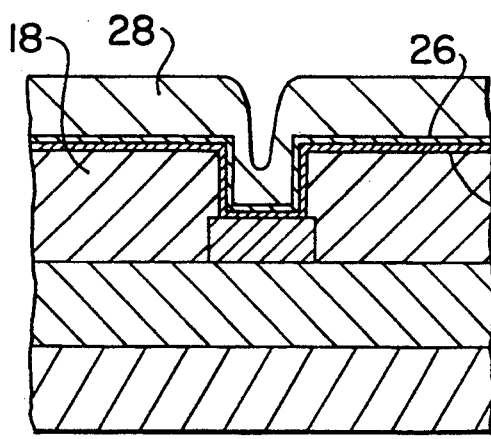
Figure 1D:
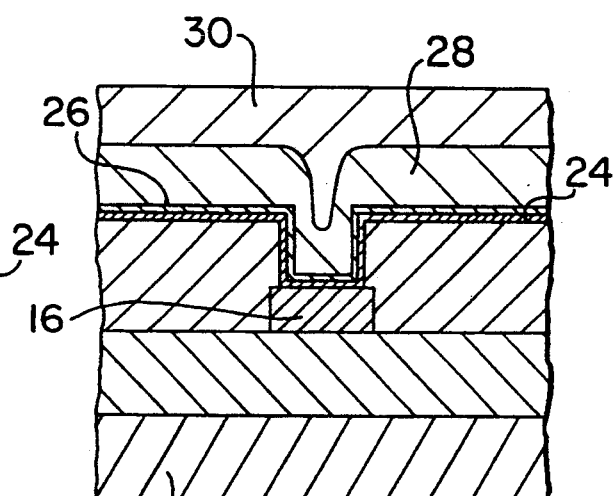
Figure 1E:
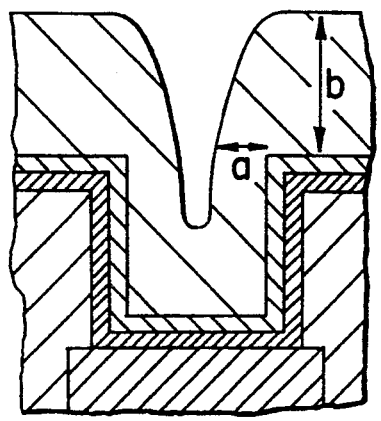

After deposition of the adhesion layer 24 the flow rates of the reactive gas mixture was changed and a layer of a first thickness of tungsten 28 was deposited (FIG. 1c). About 5000 Å tungsten was deposited using a low $H_2/WF_6$ ratio of about 6 to 8, and 0 to 15 sccm of silane, in nitrogen, at a total pressure of ~9 Torr, to a sufficient thickness to fill the contact vias. The first thickness of tungsten 28 forms tungsten plugs which fill the via holes with high step coverage. Advantageously, a film having a step coverage >60% is provided to substantially fill steep-sided vias using the process parameters listed in Example 1, step 3.

After deposition of the first thickness of tungsten 28, the flow rates of the reactive gas mixture are changed to increase $H_2/WF_6$ ratio to ~20, with 0 to 15 sccm of silane, while maintaining the total pressure at ~9 Torr. A layer of a second thickness of tungsten 30 is then deposited under conditions that result in a film having a smaller grain size, and a smoother surface, As an example, suitable process parameters are listed in Example 1, step 4. A second thickness 30 of ~5000 Å of tungsten was provided having a smaller grain size than the first thickness, and having a smooth surface, characterised by a low diffuse reflectivity and high specular reflectivity, to form a conductive layer which may be photolithographically patterned to define interconnect structures, i.e. conductive metal lines of the integrated circuit.

Thus, tungsten metallization for an integrated circuit was formed by depositing layers of tungsten in stages of a process in which the mixture of reactant gases was sequentially changed to control the structure and characteristics of the resulting tungsten layer. After deposition of a thin nucleation layer of tungsten having good adhesion to the substrate, a layer 28 of first thickness of tungsten having good step coverage was deposited filling via holes 20 with tungsten. Subsequently, the reactant gas mixture was changed and tungsten was deposited overall to provide a layer of a second thickness of tungsten having a smooth surface, with low diffuse reflectivity which may be lithographically patterned for defining interconnect structures.

The step coverage of the 5000 Å layer of tungsten filling the vias was >60% and the film stress when deposited at 480° C. are, acceptable. In deposition of the interconnect layer the $H_2/WF_6$ ratio was increased to ~20, to ensure low diffuse reflectivity, i.e. a smooth surface to the tungsten interconnect film. The step coverage was lower, at ~40%, but this is satisfactory, because the contact via holes are almost filled with the first thickness of tungsten deposited.

The effect of varying the deposition parameters, i.e. the pressure, gas flows, flow ratios of the reactive gases and deposition temperature on the characteristics of the resulting tungsten films are shown in the graphs of FIGS. 3 to 8. The graphs show the characteristics of films of tungsten including specular and diffuse reflectivity, film stress, as a function of pressure, gas flow rate ratios, temperature and film thickness. For comparison, the graphs show data relating to the characteristics of tungsten films deposited in a nitrogen carrier gas, as described above, and also for tungsten films deposited under the same conditions as in Example 1, but substituting argon (~90 sccm, see Example 3), a conventional inert carrier gas, instead of nitrogen.

The surface roughness of the resulting tungsten films was evaluated by measurement of specular reflectivity relative to bare silicon wafers and diffuse reflectivity of light at ~436 nm. Surface roughness and step coverage were investigated by scanning electron microscopy.

It was observed that replacing an inert carrier gas with nitrogen resulted in a very significant reduction in surface roughness and film stress of the deposited tungsten film (FIGS. 3 to 8).

Figure 3:
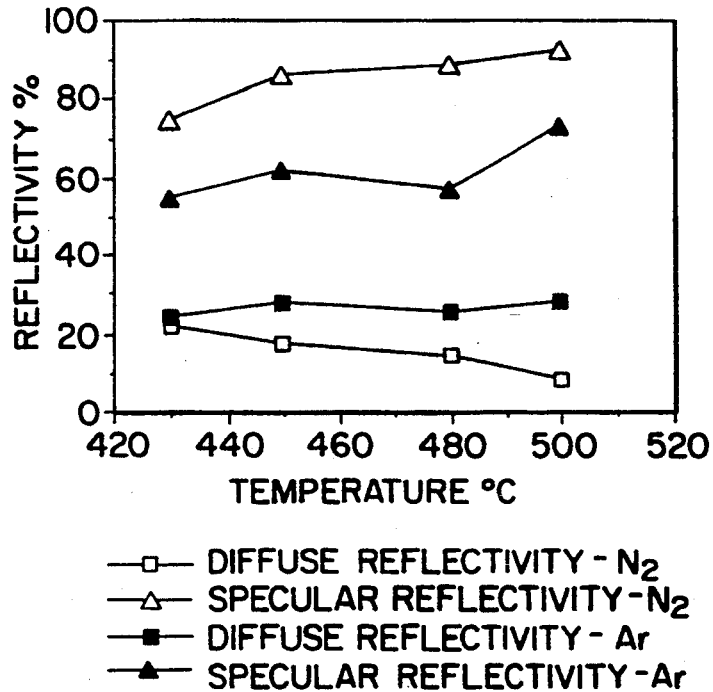
FIGS. 3 to 8 show graphs of the effects of varying process parameters on the characteristics of tungsten films deposited by the method according to the first embodiment.
Figure 4:
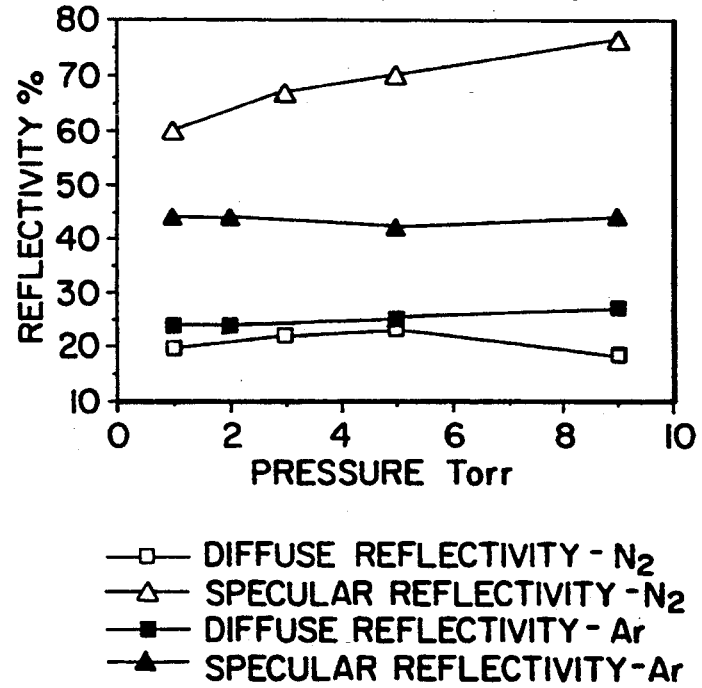

The films deposited in the presence of nitrogen were characterised by a higher specular reflectivity and lower diffuse reflectivity, resulting from a smoother film surface (FIG. 3). An improvement in specular reflectivity was observed on increasing the deposition temperature from 430° C. to 500° C. (FIG. 3) and in increasing the pressure from 1 to 9 Torr (FIG. 4). At film thicknesses $\geq 1$ $\mu$m, films deposited in a nitrogen carrier gas showed specular reflectivities over 90% compared with less than 60% for tungsten films deposited in the presence of argon.

Figure 6:
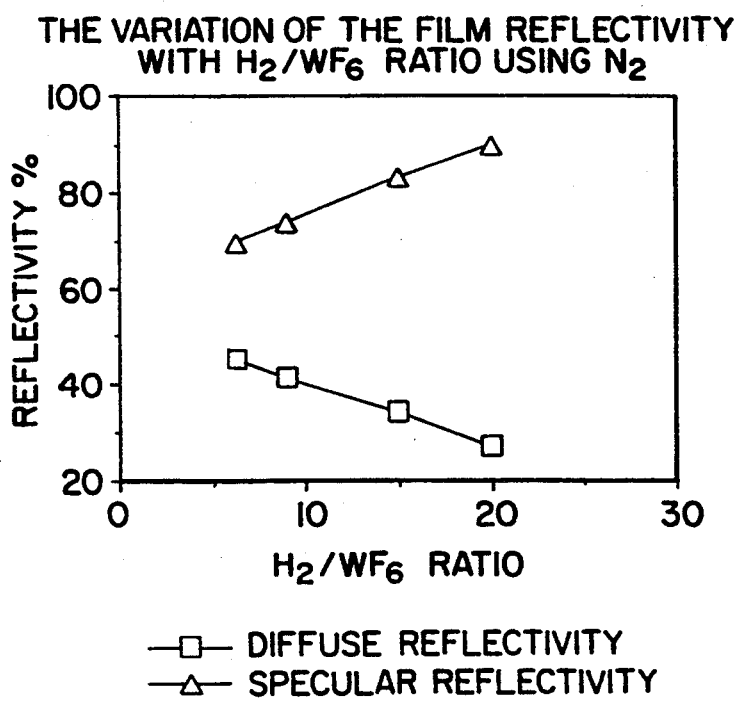
Figure 7:
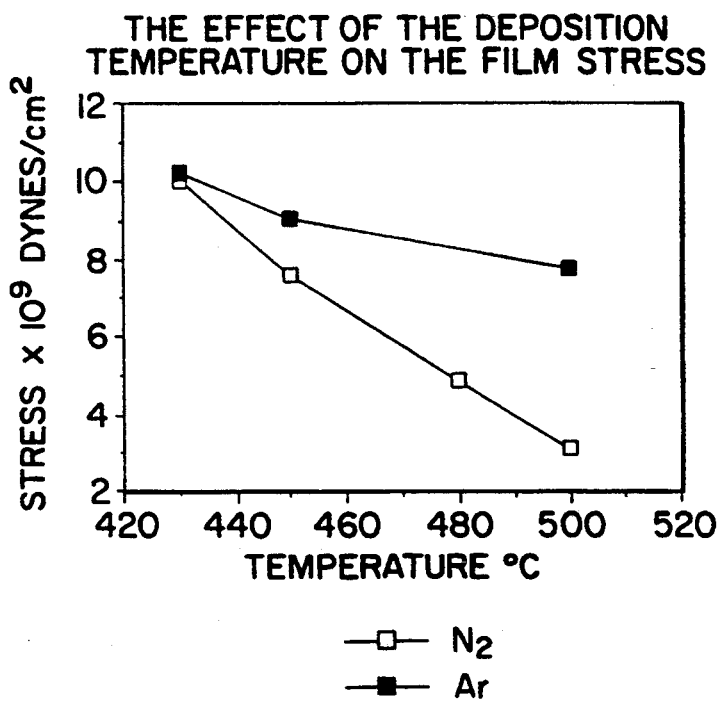

The $H_2/WF_6$ ratio in the reactant gas mixture also had a very significant effect on the film structure (FIG. 6). The $H_2/WF_6$ ratio was varied while the total flow rate was maintained constant by changing the flow rate of nitrogen. In the absence of argon in the carrier gas, increasing the $H_2/WF_6$ ratio from 5 to 20 was found to increase the specular reflectivity significantly from 70% to over 90% and decrease the diffuse reflectivity of the resulting tungsten film from ~45% to <30%.

Figure 5:
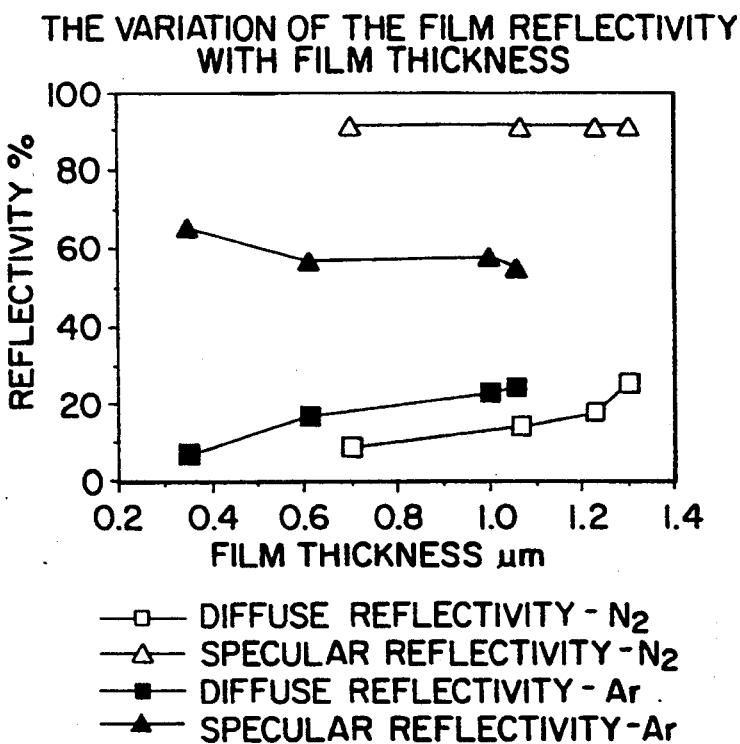

Satisfactory photo-lithographic alignment was made on tungsten films having diffuse reflectivities of less than 15%. Diffuse reflectivities less than 15% were obtained for tungsten films over ~1 $\mu$m thick (FIG. 5). For comparison, diffuse reflectivity of less than 8% is typically required for satisfactory alignment for photolithography on aluminium alloy.

Film stress was measured on an FSM 8800 Model 81006 system. A bare silicon test wafer was coated with 800 Å of sputtered TiN as an adhesion layer and the radius of curvature was measured. The wafer was then coated with a desired thickness of tungsten film and the curvature was measured again. The film stress of the tungsten film was calculated from the change in radius of curvature.

Figure 8:
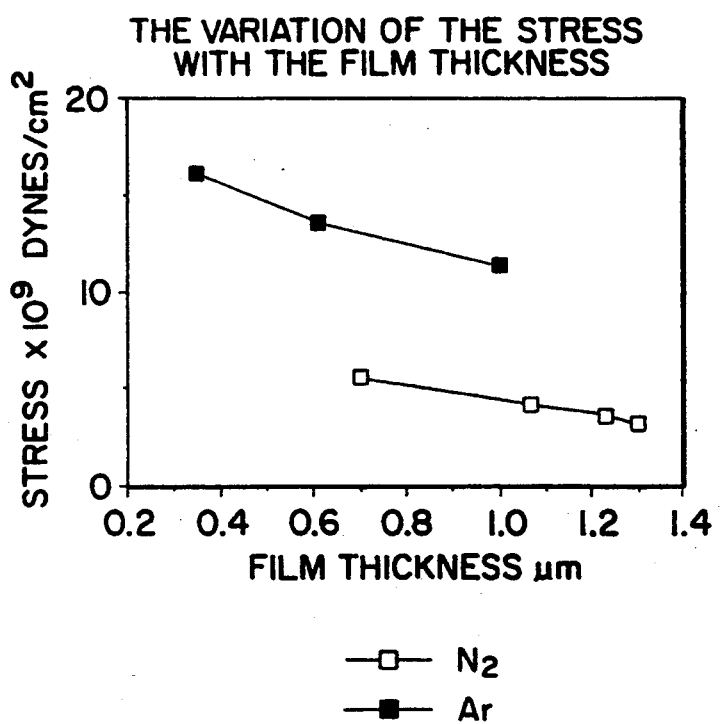

Advantageously, the film stress of thicker films of tungsten was significantly lower for tungsten films deposited from reaction in the presence of nitrogen compared with argon (FIG. 8). Deposition at higher temperatures (FIG. 7) was also beneficial in reducing the film stress. The film stress was a weak function of the $H_2/WF_6$ ratio and the pressure. A tungsten film deposited at 480° C. in $N_2$ has comparable film stress to a sputtered aluminium film of the same thickness.

Addition of silane to the reaction mixture increased the deposition rate and increased the specular reflectivity of the surface.

During deposition of the nucleation layer in step 2, to reduce Si substrate damage by reaction of $WF_6$ or fluorine by-products with silicon it was advantageous to increase $SiH_4$ flow, lower the deposition temperature and reduce the total pressure. Under the conditions listed as Example 1, step 2 ("pre-deposition") the predominant reaction was reduction of $WF_6$ by silane. However, increasing the partial pressure of $SiH_4$ in increasing the flow rate from 4 to 15 sccm at this stage of the tungsten deposition degraded the adhesion of the tungsten film to the substrate.

For deposition of the surface layer of tungsten for interconnect in the presence of nitrogen (Example 1), the diffuse reflectivity increased from 5% to 10% with increase of film thickness from 7000 Å to 10,000 Å. On the other hand, the diffuse reflectivity of tungsten film deposited in the presence of argon (Example 3) increased from 5% to 22% with increase in film thickness from 4000 Å to 10,000 Å.

The addition of silane to the reaction mixture increases the deposition rate from, e.g. from 3800 Å/min to 4900 Å/min, and reduces surface roughness. The diffuse reflectivity was reduced by ~10% in the presence of silane (4 sccm). The moderate step coverage (~40%) of the surface layer was adequate, because the via hole is almost filled by the deposition of the first 5000 Å of tungsten. The film stress was not sensitive to the $H_2/WF_6$ ratio.

Thus, a composite structure of layers of tungsten having different characteristics together provide tungsten metallization for an integrated circuit having a low surface diffuse reflectivity, low stress and excellent step coverage in via holes.

The resulting surface layer of tungsten may be patterned and etched by a conventional known method, for example by reactive ion etching by exposure to a plasma generated from $SF_6$.

Advantageously, nitrogen flow between the wafer and the graphite chuck during deposition of tungsten reduced amount of deposition of tungsten on the back side of the wafer. An additional process step of dry etching by a conventional method, for example by exposure to a plasma generated from $SF_6$, may be used to remove excess tungsten from backside of the wafer if required.

In forming interconnect for integrated circuits, to provide good adhesion to a substrate comprising an insulating layer such as silicon dioxide, an adhesion layer such as TiN, is desirable for the successful nucleation of the blanket tungsten film. Sputtered TiN was found to be thermally stable, has good step coverage, low contact resistance and good etching properties. Other materials suitable as adhesion layers include Ti, TiW, Ti/TiN, $MoSi_2$ or $WSi_2$.

In a method of depositing tungsten according to a second embodiment of the invention, a tungsten film was deposited on a substrate 12 comprising a silicon semiconductor wafer 14, similar to that used in the first embodiment (FIG. 2). The same reference numerals are used for defining similar parts of the structures shown in FIG. 2 and FIG. 1. Process conditions are listed as Example 2. The substrate 12 has parts of a partially fabricated integrated circuit defined thereon, including a dielectric insulating layer of silicon dioxide 18 defining steep sided via holes 20 exposing a conductive layer of metal 16 therein. The first and second steps of depositing an adhesion layer 24 of ~800 Å TiN and a nucleation layer 26 of ~1000 Å of tungsten were carried out as described for the first embodiment, but substituting argon for nitrogen as the carrier gas (Example 2, steps 1 and 2).

Figure 2A:
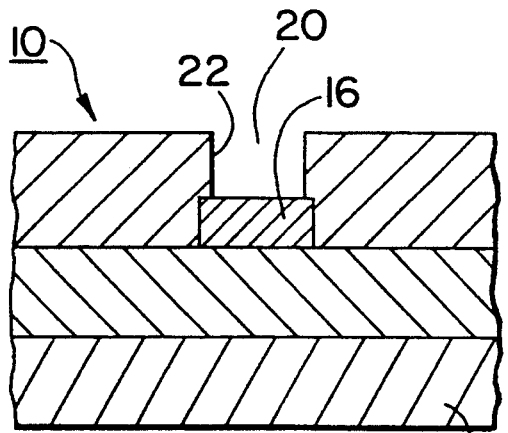
FIG. 2a–2e shows a schematic cross-sectional view of part of an integrated circuit structure at successive stages in a method of deposition of tungsten according to a second embodiment of the present invention.
Figure 2B:
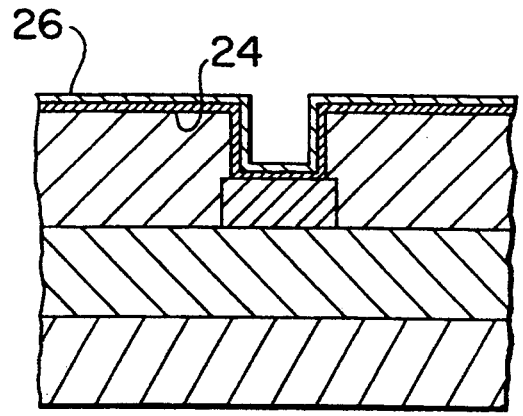
Figure 2C:
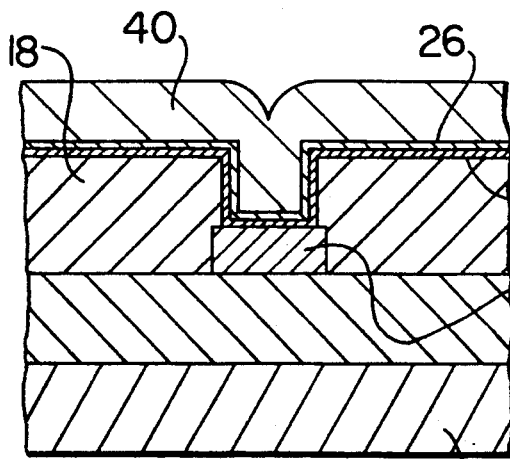

After deposition of the adhesion layer 24 and the nucleation layer 26 the flow rates of the reactive gas mixture was changed and a layer of a first thickness of tungsten 40 was deposited (FIG. 2c). About 5000 Å tungsten was deposited using a low $H_2/WF_6$ ratio of about 6 to 8, and 0 to 15 sccm of silane, in a carrier gas of argon, at a total pressure of ~9 Torr, to a sufficient thickness to fill the contact vias with a film of tungsten with high step coverage. Advantageously, a film having a step coverage ~90% (Table I: via filling) is provided to completely fill steep sided vias having an aspect ratio (depth/width) of 2, without voids using the process parameters listed in Example 2, step 3, in which the $H_2/WF_6$ is low ~6 and the temperature is 430° C. To obtain higher step coverage it is advantageous to both reduce the $H_2/WF_6$ ratio to ~6 and reduce the temperature compared with Example 1, step 3. Use of argon as the carrier gas provides for higher step coverage compared to Example 1, which used nitrogen alone as the carrier gas.

Figure 2D:
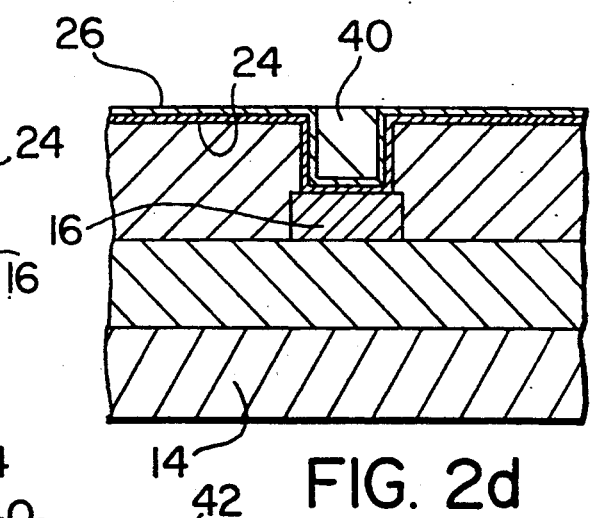
Figure 2E:
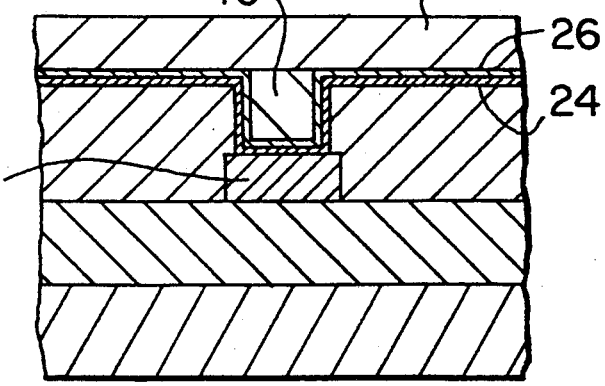

After deposition of the first thickness of tungsten 40, the via hole filling layer of tungsten is etched back, by a conventional method such as dry etching by exposure to a plasma generated from $SF_6$ (FIG. 2d). The first layer of tungsten is etched back from the surface of the substrate leaving a planarized surface with tungsten plugs filling the via holes. A second layer of tungsten 42 is then deposited overall (FIG. 2e), in the absence of argon, changing the carrier gas to nitrogen with the flow rates of the reactive gas mixture changed to increase $H_2/WF_6$ ratio to ~20, with 0 to 15 sccm of silane, while maintaining the total pressure at ~9 Torr, and increasing the temperature to 480° C. (FIG. 3) to provide a layer 42 of a second thickness of tungsten characterised by a smooth surface having a high specular reflectivity (FIG. 2e). As an example, suitable process parameters are listed in Example 2, step 4. Thus the second thickness 42 of ~5000 Å of tungsten was provided having a smaller grain size than the first thickness, and having a smooth surface, characterised by a low diffuse reflectivity and high specular reflectivity, to facilitate photo-lithography for patterning the layer 42 to define interconnect structures (Table I interconnect).

In the method of the second embodiment, the first layer is provided under reaction conditions which form a tungsten film with a very high step coverage ~90%. The latter method is therefore advantageous in filling small via holes, ~0.5 μm.

Explanation of growth mechanism of tungsten in the presence of nitrogen

It is believed that the presence of a carrier gas which is substantially unreactive in the gas phase but is chemisorbed on the tungsten surface modifies the growth mechanism of a CVD tungsten film. It was observed that replacing argon with another inert gas, helium, did not improve the surface reflectivity of deposited tungsten films in the same manner as using nitrogen as a carrier gas.

It is hypothesized that $N_2$ chemisorbed on tungsten forms an entity to which some of the partially reduced $WF_6$ or $WF_x$ is attached, and which hinders the mobility of these adsorbed species. The expected effect would be to reduce the height of the pyramidal grain and reduce the surface roughness and also degrade film step coverage.

This effect is indeed what was observed. Under similar experimental conditions the step coverage was reduced almost 30% when nitrogen replaced argon as a carrier gas.

Examination of the SEM micrographs of tungsten film reveals that steps grow first at the grain boundaries and then continue to grow up the pyramidal faces. The steepness of the pyramidal portion, believed to be a <111> face, has been shown to increase with increasing deposition temperature above 550° C. It has been hypothesised that the reactive species of the reagent gases, $WF_6$ and $H_2$ are preferentially adsorbed on these <111> faces (W. R. Holman and F. J. Huegel, Proc. Conf. CVD Refractory Metal Alloys & Compounds, p. 127, 1967).

In a CVD tungsten process at a deposition temperature <500° C. and pressure <100 Torr, the effect of gas phase reactions is negligible, and the deposition is controlled by surface reactions. For simplicity, only the major surface reactions are listed, where the symbol * represents a surface site:

$WF_6 (gas) + * \rightarrow WF_6-*$
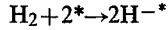
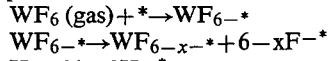
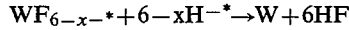

$H_2 + 2* \rightarrow 2H-*$ $WF_{6-x}-* + 6-xH-* \rightarrow W + 6HF$ $WF_6$ also reacts with the silicon substrate to form tungsten:

$WF_6 + 1.5\ Si \rightarrow W + 1.5\ SiF_4$ but the latter reaction may result in pitting of the surface of a silicon substrate. A small amount of $SiH_4$ added to the reactant gases alleviates this problem:

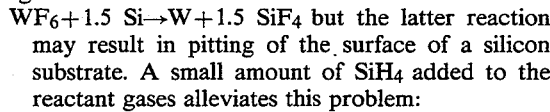
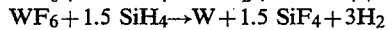

The reaction mechanism and kinetics of the $SiH_4$ based deposition are poorly understood due to the dependence of the reaction products on the gas flow ratio. However, in the examples, in step 2, pre-deposition of a thin nucleation layer of only 1000 Å of tungsten, poorer step coverage is not a concern, and the reduction of $WF_6$ by silane is the predominant reaction, which reduces pitting of substrate.

The above-described growth mechanism implies that there is a considerable surface diffusion to the site where tungsten is incorporated into the crystal lattice. Among mobile species on the surface are atomic tungsten, adsorbed $WF_{6-x}$ and adsorbed $H_2$. Atomic tungsten from complete reduction of $WF_6$ is unlikely because of the high activation energy of surface diffusion which is around 70 kcal/mole. The magnitude of surface diffusion activation energy of adsorbed $WF_6$ is not known but is estimated to be equal to its heat of condensation which is 6.35 kcal/mole. The activation energy of the $H_2$ surface diffusion is approximately 5 kcal/mole (R. W. Haskell and J. G. Byrene, "Studies in Chemical Vapour Deposition"). A plausible growth mechanism may thus be formulated as follows: $WF_6$ and $H_2$ are preferentially adsorbed at the boundary between the grains followed by partial reduction of $WF_6$ ($WF_x$). This step is followed by surface migration of the partially reduced species along the grain sides, which species is then further reduced to atomic tungsten.

The formation of small columnar grains requires changing the growth mechanism of tungsten. This may be achieved by the addition of a reactive gas that adsorbs on tungsten, acts as an anchor for the partially reduced $WF_6$, and reduces the surface mobility, but does not interfere with the chemical reaction. The reduction of the surface mobility of the adsorbed species degrades the film step coverage. However, the interconnect applications can tolerate reduced step coverage. Among carrier gases which can be used, $N_2$ chemisorbs on tungsten with a heat of chemisorption of approximately 95 kcal/mole. Furthermore, $N_2$ does not react with $WF_6$ in the gas phase. These properties make $N_2$ a good candidate for modifying the growth mechanism of tungsten film.

In the presence of nitrogen, it is hypothesized that the following steps are added to the above elementary steps:

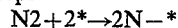
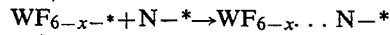

$N_2 + 2^* \rightarrow 2N-^*$ $WF_{6-x}-^* + N-^* \rightarrow WF_{6-x} \ldots N-^*$ The formation of the activated complex $WF_{6-x} \ldots N-^*$ on tungsten film is plausible, because nitrogen is known to form a ligand in tungsten complex compounds. As mentioned above, this activated complex may reduce the surface mobility of the partially reduced $WF_{6-x}$ surface species.

Although only 15–20% of the tungsten surface sites are available for $H_2$ adsorption, no decrease in deposition rate was observed which would have been expected if adsorption of hydrogen were the rate limiting step. This may validate an assumption that the desorption of HF is the rate limiting step.

Thus chemistry and deposition conditions of a CVD process based of reduction of $WF_6$ with $H_2$ in a selected carrier gas may be varied within the scope of the invention to provide tungsten films of different characteristics and thereby provide for control of the structure of the resulting tungsten film dependent on its application.

By controlling the deposition parameters for reduction of $WF_6$ by $H_2$, with or without the addition of $SiH_4$, in a carrier gas of nitrogen, tungsten films having a smooth surface characterised by low diffuse reflectivity may be deposited.

Example 1

| Parameters | Step 1 pre-heat | Step 2 pre-deposition | Step 3 deposition | Step 4 deposition interconnect | Step 5 pump-down |
|---|---|---|---|---|---|
| Time (sec) | 120 | 80 | 50 | 40 | 60 |
| Temp (°C.) | 480 | 480 | 480 | 480 | 480 |
| Pressure (Torr) | 0.100 | 0.250 | 9 | 9 | 0 |
| $H_2$ (sccm) | 0 | 360 | 240 | 800 | 0 |
| $SiH_4$ (sccm) | 0 | 4 | 9 | 9 | 0 |
| Ar (sccm) | 0 | 0 | 0 | 0 | 0 |
| $N_2$ (sccm) | 90 | 90 | 90 | 90 | 90 |
| $WF_6$ (sccm) | 0 | 14 | 40 | 40 | 0 |

Example 2

| Parameters | Step 1 pre-heat | Step 2 pre-deposition | Step 3 deposition plug filling | Step 4 deposition interconnect (etch back) | Step 5 pump-down |
|---|---|---|---|---|---|
| Time (sec) | 120 | 80 | 200 | 40 | 60 |
| Temp (°C.) | 430 | 430 | 430 | 480 | 480 |
| Pressure (Torr) | 0.100 | 0.250 | 9 | 9 | 0 |
| $H_2$ (sccm) | 0 | 360 | 360 | 800 | 0 |
| $SiH_4$ (sccm) | 0 | 4 | 9 | 9 | 0 |
| Ar (sccm) | 90 | 90 | 90 | 0 | 0 |
| $N_2$ (sccm) | 0 | 0 | 0 | 90 | 90 |
| $WF_6$ (sccm) | 0 | 14 | 40 | 40 | 0 |

Example 3

| Parameters | Step 1 pre-heat | Step 2 pre-deposition | Step 3 deposition | Step 4 deposition interconnect | Step 5 pump-down |
|---|---|---|---|---|---|
| Time (sec) | 120 | 80 | 50 | 40 | 60 |
| Temp (°C.) | 480 | 480 | 480 | 480 | 480 |
| Pressure (mTorr) | 100 | 250 | 9 | 9 | 0 |
| $H_2$ (sccm) | 0 | 360 | 240 | 800 | 0 |
| $SiH_4$ (sccm) | 0 | 4 | 9 | 9 | 0 |
| Ar (sccm) | 90 | 90 | 90 | 90 | 90 |
| $N_2$ (sccm) | 0 | 0 | 0 | 0 | 0 |
| $WF_6$ (sccm) | 0 | 14 | 40 | 40 | 0 |

TABLE I
CHARACTERISTICS OF TUNGSTEN FILM

| | Via filling | Interconnect |
|---|---|---|
| Step coverage | >90% | 60% |
| Diffuse reflectivity | 24% | 10% |
| Specular reflectivity (relative to silicon) | 60% | >90% |
| Uniformity | +/−3% | +/2−3% |
| Stress × $10^9$ dynes cm$^{-2}$ | 9–10 | 2–3 |
| Resistivity | 8.2 to 8.5 $\mu\Omega$cm | 8.2 $\mu\Omega$cm |

What is claimed is:

1. A method for chemical vapour deposition of tungsten for an integrated circuit, comprising:
exposing a substrate to a mixture of reactive gases consisting of $WF_6$, $H_2$ and a carrier gas consisting essentially of nitrogen, maintaining a pressure between 1 and 9 Torr, a deposition temperature between 430° C. and 500° C., and controlling the relative flow rates of $H_2$ and $WF_6$ to provide a $H_2/WF_6$ flow rate ratio of between 5 and 30, the mixture of gases thereby depositing on the substrate a layer of tungsten having a smooth surface.

2. A method according to claim 1 wherein the flow rate of $WF_6$ is maintained in the range 10 to 40 sccm and the reactive gas mixture includes up to 15 sccm of $SiH_4$.

3. A method according to claim 1 wherein a first thickness of tungsten is deposited while maintaining a $H_2/WF_6$ flow rate ratio between 6 and 9 to provide good step coverage on the substrate, and subsequently increasing the $H_2/WF_6$ flow rate ratio to between 20 and 30, and depositing a second thickness of tungsten, thereby forming a layer of tungsten having a smooth surface.

4. A method of chemical vapour deposition for forming a layer of tungsten for metallization for an integrated circuit, the method comprising:
exposing the substrate to a reactive gas mixture consisting of $WF_6$, $H_2$, and a carrier gas, maintaining a pressure from several mTorr to 10 Torr, and a temperature between 430° C. and 500° C., and controlling the gas flow rates to provide from 10 to 40 sccm $WF_6$ and gas flow rate ratio of $H_2/WF_6$ in the range 5 to 30, thereby depositing a layer of tungsten in at least two steps comprising:
in a first step, selecting a carrier gas consisting essentially of an inert gas, and depositing a first thickness of tungsten having good step coverage on the substrate,
and in a second step, after changing the carrier gas to consist essentially of nitrogen, depositing a second thickness of tungsten having a smooth surface 5. A method according to claim 4, comprising, in the first step maintaining a $H_2/WF_6$ flow rate ratio between 6 and 9, and in the second step, maintaining a pressure in the range from 1 to 9 Torr, and increasing the relative flow rate of hydrogen to provide a $H_2/WF_6$ flow rate ratio in the range from 20 to 30.

6. A method according to claim 5 wherein in the first step the inert gas is selected from the group consisting of argon and helium.

7. A method according to claim 4 wherein the reactive gas mixture includes up to 15 sccm of silane.

8. A method according to claim 5 wherein the deposition temperature during deposition of the first thickness of tungsten is 430° C., and the deposition temperature during deposition of the second thickness of tungsten is increased to 480° C.

* * * * *